(12) United States Patent
Haag

(10) Patent No.: US 7,838,981 B2
(45) Date of Patent: Nov. 23, 2010

(54) COMPONENT ASSEMBLY

(75) Inventor: Frieder Haag, Wannweil (DE)

(73) Assignee: Robert Bosch GmbH, Stuttgart (DE)

(*) Notice: Subject to any disclaimer, the term of this patent is extended or adjusted under 35 U.S.C. 154(b) by 326 days.

(21) Appl. No.: 12/069,786

(22) Filed: Feb. 13, 2008

(65) Prior Publication Data

US 2008/0206519 A1 Aug. 28, 2008

(30) Foreign Application Priority Data

Feb. 15, 2007 (DE) .............. 10 2007 007 503

(51) Int. Cl.
*H01L 23/48* (2006.01)
(52) U.S. Cl. .............. 257/698; 257/673; 257/704; 257/773; 257/685; 257/787; 257/E23.033; 257/E23.068
(58) Field of Classification Search ......... 257/666–733, 257/777–786, 795, E25.005, E25.006, E25.021, 257/E23.001–E23.194
See application file for complete search history.

(56) References Cited

U.S. PATENT DOCUMENTS

| 7,633,150 | B2 * | 12/2009 | Shiraishi ............. 257/704 |
| 2004/0212069 | A1 * | 10/2004 | Chen et al. ............. 257/686 |
| 2008/0042265 | A1 * | 2/2008 | Merilo et al. ............. 257/723 |

FOREIGN PATENT DOCUMENTS

DE 101 38 754 2/2001

* cited by examiner

*Primary Examiner*—Jasmine J Clark
(74) *Attorney, Agent, or Firm*—Kenyon & Kenyon LLP

(57) ABSTRACT

The present invention provides a possibility of mounting conventionally capped components, that saves much space. The component assembly includes at least one component having a cap, a substrate for the component and connecting means for mounting the component on the substrate and for the electrical connection of the component. The substrate has at least one recess. The component is mounted on the substrate in flip-chip technique, so that the cap is inserted into the recess and the component is connected to the substrate via connecting bumps in the edge region of the recess.

6 Claims, 1 Drawing Sheet

COMPONENT ASSEMBLY

FIELD OF THE INVENTION

The present invention relates to a component assembly including at least one component having a cap, a substrate for the component and connecting means for mounting the component on the substrate and for the electrical connection of the component.

BACKGROUND INFORMATION

Many micromechanical components include movable structures, which may be used to record, for example, accelerations or rates of rotation. It is known that one may provide such sensor elements with a cap, in order to protect the sensor structure from soiling and mechanical interference effects. As the substrate for circuit configurations having capped components, in practice, mostly pressed screens, so-called leadframes, are used, but also printed circuit boards. Capped components are usually adhered to the substrate at their back side and are electrically contacted via wire bonding. For reasons of space, frequently several chips, such as a micromechanical sensor element and an evaluation IC are piled one on top of another. This saves housing area, to be sure, but it makes the overall height of the housing greater.

German Patent Application No. DE 101 38 754 provides connecting two semiconductor IC component elements to each other in flip-chip technique, and to mount this compound component in or above an appropriate recess in a substrate. For this purpose, one surface of the two semiconductor IC components is prepared as the connecting side, respectively. These connecting sides face each other, and the electrical and mechanical connection between the two semiconductor IC components is simply produced via appropriately situated contact elements. The dimensioning and positioning of the two semiconductor IC components are selected so that one of the two components projects beyond the edge region of the other. In this way it is possible simply to position a component of the compound in a correspondingly dimensioned recess in the substrate, and then to mount the compound, also in flip-chip technique, on the substrate via the connecting side of the other component.

SUMMARY OF THE INVENTION

The present invention provides a possibility of mounting conventional capped components that saves much space.

To do this, the substrate of the component assembly has at least one recess. The component is mounted on the substrate in flip-chip technique, in such a manner that the cap is fitted into the recess, and the component is connected to the substrate via connecting bumps in the edge region of the recess.

That is, the present invention provides using the flip-chip technique for electrical contacting and mechanical fixing even for capped components, although these are not provided with a freely accessible connecting surface. The low overall height of the component assembly, according to the present invention, is essentially to be attributed to the fitting in of the component cap into a corresponding recess of the substrate. But the low space requirement is also based on the use of the flip-chip technique, which permits a very dense positioning of components on the substrate.

The component assembly according to the present invention may be implemented not only using capped monochips, but also chip stacks in which the uppermost chip is provided with a cap. This variant proves itself as being advantageous particularly with respect to a comparatively low overall height of the device at a particularly small housing area.

In order to make the handling of the component assembly according to the present invention simpler, the cap of the component should be seal-surrounded by the substrate or back side of the substrate. In this connection, it turns out to be advantageous if the thickness of the substrate material and the thickness of the connecting bumps are adjusted to the height of the cap. In particular, the connecting bumps permit a simple leveling between the cap and the substrate. Laminates, such as printed-circuit boards or pressed screens, so-called leadframes, for example, which are easily provided with recesses for the component caps, are suitable as substrates. In connection with these substrate materials, the connecting bumps may be implemented, for example, simply in the form of solder bumps, copper bumps or gold bumps, or adhesive bumps.

For the additional stabilization of the component assembly according to the present invention, the mounted component may further be embedded at least partially in a molding material.

DETAILED DESCRIPTION

Figure 1:
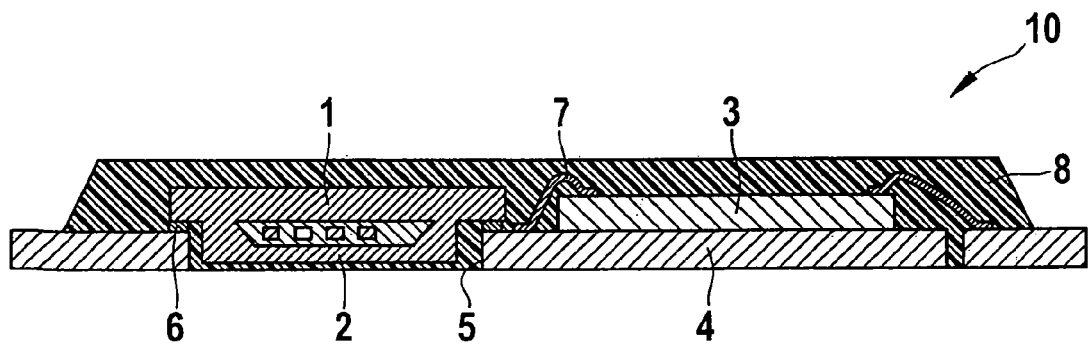
FIG. 1 shows a first variant of a component assembly according to the present invention, in a schematic sectional representation.

Component assembly 10 shown in FIG. 1 includes a micromechanical component 1 having a cap 2 and a semiconductor IC component 3, which are mounted side by side on a common substrate.

In substrate 4 a recess 5 is formed, which is dimensioned corresponding to cap 2 of component 1. Capped component 1 was inserted into recess 5 using cap 2, so that the edge region of component 1, that projects beyond cap 2, overlaps the edge region of substrate 4 which surrounds recess 5. In this overlapping region, connecting bumps 6 are situated, which form both a mechanical and an electrical connection between component 1 and substrate 4. In addition, a height equalization between cap 2 and substrate 4 may be implemented via connecting bumps 6, so that cap 2 does not project from the lower side of substrate 4. Therefore, cap 2 should not be thicker than the thickness of substrate 4 plus the thickness of connecting bumps 6.

Semiconductor IC component 3 is fixed mechanically on substrate 4 by its back side. The electrical connection is produced via bonding wires 7, in this instance.

In the exemplary embodiment shown in FIG. 1, the entire component assembly 10 was extrusion-coated using a molding material 8, so that the two components 1 and 3 are completely embedded and well protected.

For the side by side construction shown in FIG. 1, laminates are particularly suitable as substrates, such as printed-circuit boards. The connecting bumps may be implemented in the form of solder bumps, copper pillar bumps, stud bumps or even adhesive flip-chip bumps.

Figure 2:
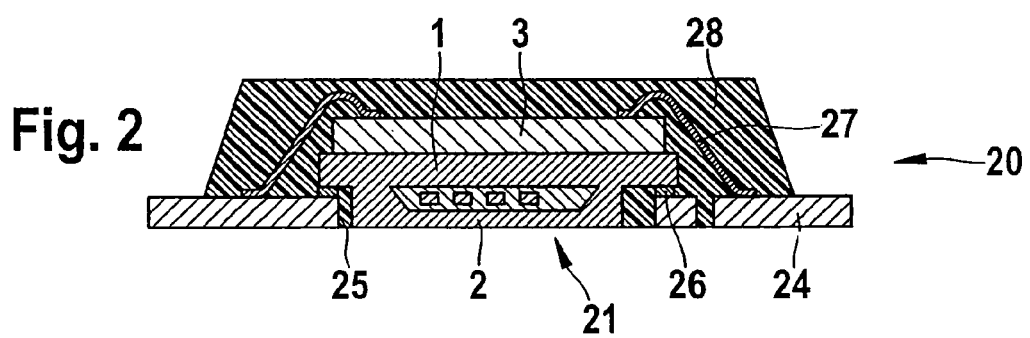
FIG. 2 shows a second variant of a component assembly according to the present invention, also in a schematic sectional representation.

Component assembly 20 shown in FIG. 2 includes a chip stack 21 which is mounted on a substrate 24. Chip stack 21 is made up of a micromechanical component 1 having a cap 2 and a semiconductor IC component 3, the capped component 1 being situated on component 3 and being connected to it.

Here too, in substrate 24 a recess 25 is formed, which is dimensioned corresponding to cap 2 of component 1. Chip stack 21 was inserted, headfirst with cap 2, into recess 25, so that the edge region of component 1, that projects beyond cap 2, overlaps the edge region of substrate 4 which surrounds recess 5. As in the exemplary embodiment shown in FIG. 1, connecting bumps 26 are situated in this overlapping region, which form a mechanical connection between chip stack 21 and substrate 24. In addition, at least component 1 of chip stack 21 is able to be contacted electrically via connecting bumps 26. The electrical connection between semiconductor IC component 3 of chip stack 21 and substrate 24 is produced in this case via bonding wires 27.

In the exemplary embodiment shown in FIG. 2, the thickness of the connecting bumps 26 was selected so that cap 2 is level with the back side of substrate 24, in order to achieve an overall height that is as low as possible. As in the case of FIG. 1, the entire component assembly 20 was also extrusion-coated using a molding material 28, so that chip stack 21 is completely embedded up to the front side of cap 2 and is well protected.

The construction shown in FIG. 2 is preferably implemented using pressed screens as substrate, solder bumps, copper pillar bumps, stud bumps and even adhesion flip-chip bumps being able to be used as connecting bumps.

Figure 3:
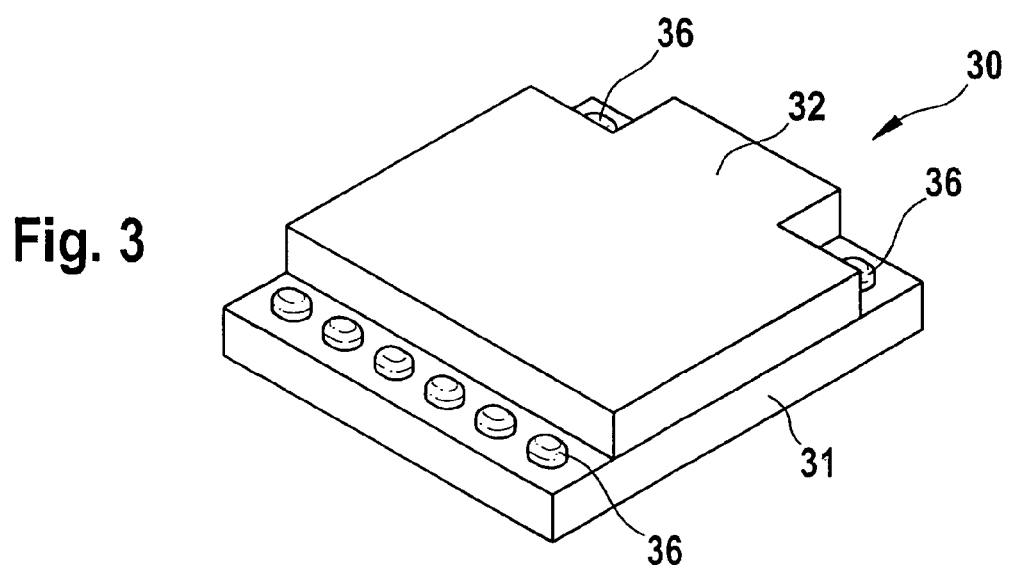
FIG. 3 shows a perspective top view of a capped component for a mounting corresponding to the present invention.

The component assembly according to the present invention may be implemented particularly simply if the cap sits geometrically isolated on the component. But it may also be implemented if the component is developed, with a plurality of components of the same kind, on one wafer which is then provided with a correspondingly patterned cap wafer, so that, after dicing up, the components have only a comparatively narrow edge region projecting beyond the cap. Such a compound 30 is shown in FIG. 3. Cap 32 is bonded, in this case, onto a micromechanical sensor element 31 as part of a patterned cap wafer. In order to mount this compound 30 on a substrate, according to the present invention, the latter has to be provided with a recess which essentially corresponds to the complement of the cap shape. FIG. 3 also illustrates the positioning of connecting bumps 36 in the edge region of sensor element 31 projecting beyond cap 32.

What is claimed is:

1. A component assembly, comprising:
at least one component having a micromechanical element and a cap covering an area of the micromechanical element, the cap configured to seal the entire area of the micromechanical element covered by the cap against soiling and mechanical interference effects;
a substrate for the component, the substrate having at least one recess; and
a connecting element for mounting the component on the substrate and for an electrical connection of the component,
wherein the component is mounted on the substrate in flip-chip technique, so that the cap is inserted into the recess and the component is connected to the substrate via connecting bumps in an edge region of the recess.

2. The component assembly according to claim 1, wherein the component includes a chip stack.

3. The component assembly according to claim 1, wherein a thickness of a substrate material and a thickness of the connecting bumps are adjusted to a height of the cap.

4. The component assembly according to claim 1, wherein the substrate includes at least one of a laminate and a leadframe.

5. The component assembly according to claim 1, wherein the connecting bumps include one of (a) solder bumps, (b) copper bumps, (c) gold bumps and (d) adhesive bumps.

6. The component assembly according to claim 1, wherein the mounted component is embedded at least partially in a molding material.

* * * * *